United States Patent
Brenden et al.

(10) Patent No.: US 8,774,643 B2
(45) Date of Patent: Jul. 8, 2014

(54) OPTICAL SOURCE DRIVER CIRCUIT HAVING OVERSHOOT CONTROLLER

(75) Inventors: Jason P. Brenden, Woodbury, MN (US); Xuemin Yang, Edina, MN (US); Cameron C. Rabe, Inver Grove Heights, MN (US)

(73) Assignee: LSI Corporation, San Jose, CA (US)

( * ) Notice: Subject to any disclaimer, the term of this patent is extended or adjusted under 35 U.S.C. 154(b) by 134 days.

(21) Appl. No.: 13/525,982

(22) Filed: Jun. 18, 2012

(65) Prior Publication Data

US 2013/0336663 A1 Dec. 19, 2013

(51) Int. Cl.
*H04B 10/04* (2006.01)

(52) U.S. Cl.
USPC ............ 398/197; 398/182; 398/193; 398/195

(58) Field of Classification Search
USPC .................................. 398/197, 195, 193, 182
See application file for complete search history.

(56) References Cited

U.S. PATENT DOCUMENTS

| | | | |
|---|---|---|---|
| 7,068,691 B2 | 6/2006 | Chujo et al. | |
| 7,433,377 B2 | 10/2008 | Quinn et al. | |
| 7,701,480 B2 | 4/2010 | Omori et al. | |
| 2004/0095853 A1* | 5/2004 | Masui et al. | 369/13.24 |
| 2005/0243879 A1* | 11/2005 | Horiuchi et al. | 372/38.07 |
| 2008/0225106 A1* | 9/2008 | Omori et al. | 347/237 |
| 2012/0293783 A1* | 11/2012 | Ishida et al. | 355/67 |

* cited by examiner

*Primary Examiner* — Kinam Park
(74) *Attorney, Agent, or Firm* — Ryan, Mason & Lewis, LLP

(57) ABSTRACT

A driver circuit configured to generate a drive signal for an optical source comprises an overshoot controller that provides an amount of overshoot for a given logic state of the drive signal as a function of a duration of at least one previous logic state of the drive signal. The drive signal may alternate between a first logic state associated with a first operating mode of the optical source and a second logic state associated with a second operating mode of the optical source. The overshoot controller may be configured to provide amounts of overshoot for respective instances of the first logic state that are proportional to the durations of their respective immediately preceding second logic states. The driver circuit may be implemented in a heat-assisted magnetic recording system in which the optical source alternates between on and off states associated with respective magnetic write and magnetic read modes.

20 Claims, 3 Drawing Sheets

OPTICAL SOURCE DRIVER CIRCUIT HAVING OVERSHOOT CONTROLLER

BACKGROUND

Optical sources are in widespread use for data storage and communication applications, and include lasers of many different types and configurations. By way of example, such lasers may be implemented using one or more laser diodes each having an associated laser driver circuit.

Lasers are utilized in a wide variety of optical disk recording and playback systems. Standardized optical disk storage formats have recently evolved from Digital Versatile Disk (DVD) to Blu-ray. A Blu-ray disk is read using a blue laser having a wavelength of 405 nanometers, significantly shorter than the 650 nanometer red laser used to read DVDs. Information can therefore be stored at a much higher density on Blu-ray disks. For example, a single layer Blu-ray disk can store about 25 Gigabytes (GB) of data, compared to about 5 GB for a DVD. Higher storage densities can be achieved by configuring the optical disk to include multiple storage layers, as is well known.

In addition, three-dimensional (3D) image information for movies or other types of content can be stored on Blu-ray disks and other optical disks. A 3D optical disk playback device can read such information from the optical disk and provide a corresponding 3D image signal output for presentation on a television or other display device, thereby providing a 3D viewing experience to its users.

Lasers may also be utilized in other types of recording applications, including magnetic recording systems. For example, a magnetic recording technique known as heat-assisted magnetic recording (HAMR) utilizes a laser to locally preheat an area on the surface of a magnetic storage disk prior to performing magnetic recording in that area. This facilitates the magnetic recording process, thereby allowing data to be stored in a higher density than would otherwise be possible.

There are numerous other types of systems that utilize lasers outside of the recording or playback context, including optical communication systems. In such communication systems, for example, lasers may be used to generate modulated optical signals for transmission over optical fiber.

In systems of the type described above, a laser driver circuit may be utilized to drive current to a laser diode in order to allow the laser diode to turn on so as to provide light output. The laser diode typically needs to be transitioned rapidly between its on and off states in order to support the high data rates that are often utilized for recording, playback or communication applications.

SUMMARY

Illustrative embodiments of the invention provide optical source driver circuits that include overshoot controllers. Such a driver circuit may be used, for example, to drive a laser diode in an optical system. The incorporation of an overshoot controller allows the driver circuit to generate a drive signal that is provided with an amount of overshoot selected to compensate for time dependent thermal effects that might otherwise adversely impact laser performance in a variety of different applications.

For example, an amount of overshoot provided in the drive signal when turning the laser diode on may increase with increasing duration of a preceding period of time for which the laser diode was turned off. Thus, when the laser diode is turned off only for a relatively short period of time before being turned back on, less overshoot is provided in the portion of the drive signal that turns the laser diode on. In this scenario, the laser diode has not had an opportunity to cool, and thus less overshoot is provided. On the other hand, when the laser diode is turned off for a relatively long period of time before being turned back on, the laser diode has had an opportunity to cool, and therefore more overshoot is provided in the portion of the drive signal that turns the laser diode on.

In one embodiment, a driver circuit configured to generate a drive signal for a laser diode or other optical source comprises an overshoot controller that provides an amount of overshoot for a given logic state of the drive signal as a function of a duration of at least one previous logic state of the drive signal.

The drive signal may alternate between a first logic state associated with a first operating mode of the optical source and a second logic state associated with a second operating mode of the optical source.

In such an arrangement, the overshoot controller may be configured to provide amounts of overshoot for respective instances of the first logic state that are proportional to the durations of their respective immediately preceding second logic states. Accordingly, one of the instances of the first logic state having an immediately preceding second logic state of relatively short duration is provided with a relatively small amount of overshoot, and another one of the instances of the first logic state having an immediately preceding second logic state of relatively long duration is provided with a relatively large amount of overshoot.

The driver circuit may be implemented in a HAMR system in which the optical source alternates between magnetic write and magnetic read modes corresponding to respective on and off states of the optical source. Other embodiments may be implemented in the form of an optical disk recording and playback system, an optical communication system, or any other type of system that comprises one or more driver circuits for driving respective laser diodes or other types of optical sources.

DETAILED DESCRIPTION

Embodiments of the invention will be illustrated herein in conjunction with an exemplary optical disk recording and playback system that incorporates a laser comprising a laser driver circuit with an overshoot controller. It should be understood, however, that embodiments of the invention are not limited to the particular systems, lasers, circuitry, overshoot controllers and associated techniques shown and described. The disclosed arrangements are more generally applicable to any system that comprises one or more lasers or other optical sources, and may be implemented using components other than those specifically shown and described in conjunction with the illustrative embodiments. For example, another embodiment of the invention may comprise a magnetic recording system in which a laser or other optical source is utilized to preheat a magnetic recording medium in order to facilitate subsequent magnetic recording, or an optical communication system in which one or more lasers or other optical sources are utilized to generate modulated optical signals for transmission over optical fiber.

Figure 1:
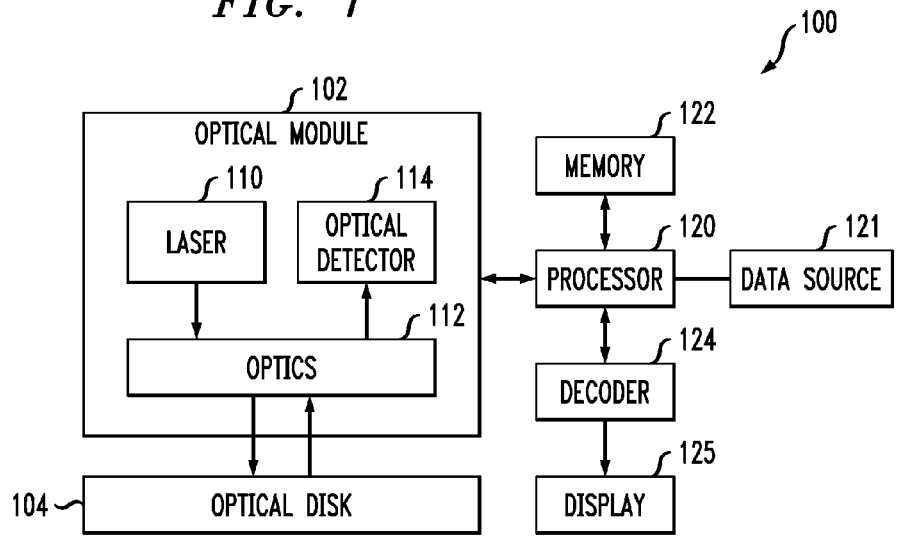
FIG. 1 is a block diagram of an optical disk recording and playback system that incorporates a laser comprising a driver circuit with an overshoot controller in an illustrative embodiment of the invention.

FIG. 1 shows an optical disk recording and playback system 100 in accordance with an illustrative embodiment of the invention. The recording and playback system 100 in this embodiment more specifically comprises an optical module 102 that writes information to an optical disk 104 in a write mode of operation and reads information from the optical disk 104 in a read mode of operation. The optical disk 104 is therefore assumed to be a recordable optical disk, although numerous other types of optical disks, or more generally storage media, may be used in other embodiments. An "optical module" as the term is broadly utilized herein is not restricted to include only optical components, and will also generally include, for example, electrical components such as laser driver circuitry.

In a typical configuration, the optical disk 104 is inserted in a disk drive which controls the rotation of the disk as well as the positioning of laser light from the optical module 102 relative to grooves of the disk. The drive mechanisms and associated electronics for controlling rotation of the optical disk 104 and positioning of the optical module 102 are omitted from the figure for clarity and simplicity of illustration, but may be assumed to be implemented in a conventional manner.

The optical module 102 in the present embodiment comprises a laser 110, optics 112 and an optical detector 114. It will therefore be assumed without limitation that there is a single laser and associated optical detector in the present embodiment, although other numbers of lasers and detectors can be used in other embodiments. Also, these or other similar components need not be part of a single module, but could instead be implemented using separate modules in other embodiments.

The laser 110 may have a wavelength particularly adapted for writing or reading information on a particular type of optical disk, such as a Blu-ray or DVD optical disk, each of which may be configured to store 2D or 3D information. Multiple layer optical disks of these and other formats may also be used.

As a more particular example, the laser 110 may comprise a blue laser having a wavelength of approximately 400 nanometers suitable for reading stored information from a Blu-ray optical disk, or a red laser having a wavelength of approximately 650 nanometers suitable for reading stored information from a DVD optical disk. As indicated previously, other embodiments may utilize a combination of two or more lasers, and such lasers may have distinct wavelengths.

It may also be assumed in one or more of the illustrative embodiments that the optical disk 104 is a conventional 2D optical disk, such as a 2D Blu-ray optical disk or a 2D DVD optical disk, where the disk stores 2D image information but is not otherwise specially configured in any way for 3D playback. Alternatively, the optical disk 104 may comprise a 3D optical disk.

The optics 112 may be viewed as an example of what is more generally referred to herein as an "optical assembly." The term "optical assembly" as used herein is intended to be broadly construed, and may comprise any arrangement of optical elements used to direct light to and from the optical disk 104, and may also include associated structural, mechanical or electrical elements. For example, an optical assembly may comprise separate sets of optics associated with each of multiple lasers, or may utilize at least a subset of its optical elements to process light from multiple lasers. As another example, an optical assembly as the term is broadly used herein may be configured to generate multiple incident light beams from the output of a single laser. It should therefore be appreciated that embodiments of the invention do not require any particular arrangement of optics for directing light to and from the optical disk.

The optical module 102 is coupled to a processor 120 which controls the operation of the optical module and processes signals supplied by and delivered to that unit. The processor 120 may comprise, by way of example, a microprocessor, a digital signal processor (DSP), an application-specific integrated circuit (ASIC), a field-programmable gate array (FPGA), or other integrated circuit device, as well as portions or combinations of such devices. The processor 120 may be viewed as an example of what is more generally referred to herein as "controller circuitry." Such controller circuitry, although shown as separate from the optical module 102 in the present embodiment, may be implemented at least in part within the optical module in other embodiments. As the term is used herein, "controller circuitry" may therefore encompass, again by way of illustrative example and without limitation, disk drive electronics, signal processing electronics, and associated processing and memory circuitry, as well as one or more related electromechanical elements utilized to control positioning of the optical module 102 relative to the surface of the optical disk 104.

The controller circuitry as described above is assumed to be coupled to an input of the laser 110 and to provide an input data signal thereto from data source 121 for recording on the optical disk 104. The data source 121 is illustratively shown as being coupled to optical module 102 via the processor 120, but other types of data source connections may be used in other embodiments.

The controller circuitry as described above is also assumed to be coupled to an output of the optical detector 114 and to receive a detected signal therefrom for further processing associated with optical disk playback, and may additionally be coupled to other elements of the optical module, such as one or more signal inputs of an overshoot controller associated with a driver circuit of the laser 110.

Also associated with the processor 120 in the optical disk recording and playback system 100 is memory 122 and decoder 124. The memory 122 stores executable code that may be executed by processor 120 in implementing at least a portion of the recording and playback functionality of the optical disk recording and playback system 100, such as providing automatic overshoot control in a driver circuit of laser 110. The memory 122 may comprise electronic memory such as random access memory (RAM) or read-only memory (ROM), in any combination, and is an example of what is more generally referred to herein as a "computer-readable storage medium."

The decoder 124 may comprise, for example, a DVD or Blu-ray decoder in embodiments designed to support playback of respective DVD and Blu-ray optical disks. Alternatively, separate DVD and Blu-ray decoders in an embodiment designed to support playback of both DVD and Blu-ray optical disks. Such decoders may be configured to provide, for example, H.264, MPEG-2 and/or MPEG-4 decoding functionality, or other types of decoding functionality, as required to support one or more particular video coding formats in a given embodiment. In other embodiments, a single decoder may be used to support multiple optical disk formats.

An information signal read out from the optical disk 104 is processed by decoder 124 to generate a video signal or other image signal suitable for presentation on display device 125. The display device may comprise, for example, a television, computer, mobile telephone, or any other processing device having an ability to display video or other information read out from the optical disk 104 via the optical module 102.

The optical detector 114 may comprise a single photodetector array, although other embodiments may utilize multiple photodetector arrays and possibly additional associated circuitry, for generating one or more data streams using laser light reflected from the optical disk. Accordingly, a given optical detector may comprise additional electronic circuitry, such as level-shifting circuitry, conversion circuitry, or other types of circuitry, that is coupled to or incorporated into a photodetector array. Such circuitry is intended to be encompassed by the general term "optical detector" as used herein.

The optics 112 in this embodiment more specifically comprise optical elements which are arranged for directing light from the laser 110 to the optical disk 104 and from the optical disk 104 to the optical detector 114. For example, in the read mode of operation, the optics 112 direct the incident light from the laser 110 to form a scanning spot on the optical disk, and direct the corresponding reflected light from the scanning spot to the optical detector 114. The optics are also utilized to direct modulated incident light from the laser 110 so as to write data from the data source 121 to the optical disk in a write mode of operation. In other embodiments, separate read and write lasers with respective separate sets of optics may be used to support respective read and write modes of operation.

The system elements 102, 120, 122 and 124 may comprise elements of an otherwise conventional optical disk recording and playback device, such as a Blu-ray recorder and player that is also backwards compatible with the DVD format. One or more such elements may be implemented in a processing device such as the television, computer, mobile telephone, or other processing device that provides the display device 125. The data source 121 is assumed to be part of the system 100 in this embodiment, but in other embodiment may be arranged at least in part externally to system 100.

System elements such as laser 110, optical detector 114, processor 120, data source 121, memory 122 and decoder 124 may be implemented at least in part in the form of one or more integrated circuits, such as an otherwise conventional system-on-chip (SOC) integrated circuit designed for use in an optical disk recording and playback system and suitably modified to support optical disk recording and playback functionality as disclosed herein. Thus, for example, driver circuitry of the laser 110, and an associated overshoot controller, may be implemented in the form of an integrated circuit.

In an integrated circuit implementation, multiple integrated circuit dies are typically formed in a repeated pattern on a surface of a wafer. Each such die may include a device as described herein, including at least one driver circuit having at least one overshoot controller, and may include other structures or circuits. The dies are cut or diced from the wafer, then packaged as integrated circuits. One skilled in the art would know how to dice wafers and package dies to produce packaged integrated circuits. Integrated circuits so manufactured are considered embodiments of this invention.

The optical disk playback system 100 as illustrated in FIG. 1 may include other elements in addition to or in place of those specifically shown, including one or more elements of a type commonly found in a conventional implementation of such a system. These and other conventional elements, being well understood by those skilled in the art, are not described in detail herein. It should therefore be understood that the particular arrangement of elements shown in FIG. 1 is presented by way of illustrative example only. Accordingly, those skilled in the art will recognize that a wide variety of other optical disk recording and playback system configurations may be used in implementing the invention.

For example, as noted above, alternative embodiments of the invention may include multiple lasers, and corresponding optics and optical detectors, and may also include systems that perform only recording or only playback.

Also, as indicated previously, other embodiments can include any type of system that incorporates one or more lasers, such as magnetic recording systems that utilize lasers to perform localized heating of the magnetic recording medium prior to magnetic recording, and optical communication systems. Optical and magnetic disk systems of the type described above are examples of what are more generally referred to herein as disk-based storage systems, and such systems may be configured for at least one of recording and playback of data on an optical or magnetic disk.

Figure 2:
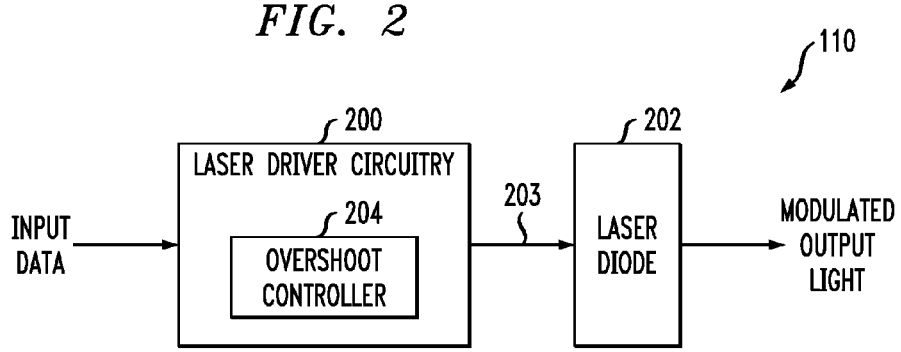
FIG. 2 shows a more detailed view of the laser of the FIG. 1 system.

FIG. 2 shows a more detailed view of the laser 110 in a write mode of operation of the optical disk recording and playback system 100. The laser 110 comprises laser driver circuitry 200 coupled to a laser diode 202 via a transmission line 203. The laser driver circuitry 200 is an example of what is more generally referred to herein as a "driver circuit" that is adapted for coupling to an optical source. The laser driver circuitry 200 generates a drive signal for the laser diode 202. The laser driver circuitry 200 comprises an overshoot controller 204 which controls an amount of overshoot provided in designated portions of the drive signal, such as those portions corresponding to a particular logic state of the drive signal that causes the laser diode 202 to be turned on so as to generate light output.

As will be described in greater detail below, the overshoot controller 204 adjusts an amount of overshoot provided for a given logic state of the drive signal as a function of a duration of at least one previous logic state of the drive signal. In the present embodiment, the drive signal is assumed to alternate between a first logic state associated with a first operating mode of the laser diode 202 and a second logic state associated with a second operating mode of the laser diode 202, where the first and second operating modes correspond to respective on and off states of the laser diode 202.

The overshoot controller 204 is more particularly configured to provide amounts of overshoot for respective instances of the first logic state of the drive signal that are proportional to the durations of their respective immediately preceding second logic states of the drive signal. Accordingly, in the present embodiment, one of the instances of the first logic state having an immediately preceding second logic state of relatively short duration is provided with a relatively small amount of overshoot, and another one of the instances of the first logic state having an immediately preceding second logic state of relatively long duration is provided with a relatively large amount of overshoot.

The overshoot controller 204 therefore allows the driver circuit 200 to generate a drive signal having an amount of overshoot selected to compensate for time dependent thermal effects that might otherwise adversely impact laser performance, particularly at high data rates. For example, an amount of overshoot provided in the drive signal when turning the laser diode 202 on may increase with increasing duration of a preceding period of time for which the laser diode 202 was turned off. Thus, when the laser diode 202 is turned off only for a relatively short period of time before being turned back on, less overshoot is provided in the portion of the drive signal that turns the laser diode on. In this scenario, the laser diode has not had an opportunity to cool, and thus less overshoot is provided. However, when the laser diode 202 is turned off for a relatively long period of time before being turned back on, the laser diode has had an opportunity to cool, and therefore more overshoot is provided in the portion of the drive signal that turns the laser diode on.

In the write mode of the optical recording and playback system 100, the laser diode 202 alternates between on and off states responsive to input data to be recorded on the optical disk 104 as indicated by respective high and low logic states of the drive signal, thereby producing modulated output light. This write mode of operation of system 100 is therefore similar to the typical operation of a laser diode in an optical communication system, where the modulated output light of the laser diode may be used to drive an optical fiber or other type of optical communication medium.

The read mode in the system 100 in the present embodiment will generally utilize a constant light output from the laser diode 202 to read stored data from the optical disk 104, although the laser diode 202 may nonetheless be turned off and then back on under certain conditions within the read mode of operation.

The term "operating mode" as used herein in the context of a laser diode or other optical source should therefore be construed broadly so as to encompass an on state or off state of the laser diode, or other type of operating mode. For example, in an exemplary HAMR system, the laser diode alternates between magnetic write and magnetic read modes corresponding to respective on and off states of the laser diode. Thus, in the HAMR system, the laser diode is in its on state during a magnetic write mode and in its off state during a magnetic read mode. This is because laser heating using light output of the laser diode is generally only used in conjunction with magnetic recording in such a system.

Although shown as part of the laser 110 in the FIG. 2 embodiment, in other embodiments at least a portion of the laser driver circuitry 200 may be implemented outside of the laser 110, such as in a separate integrated circuit.

Figure 3:
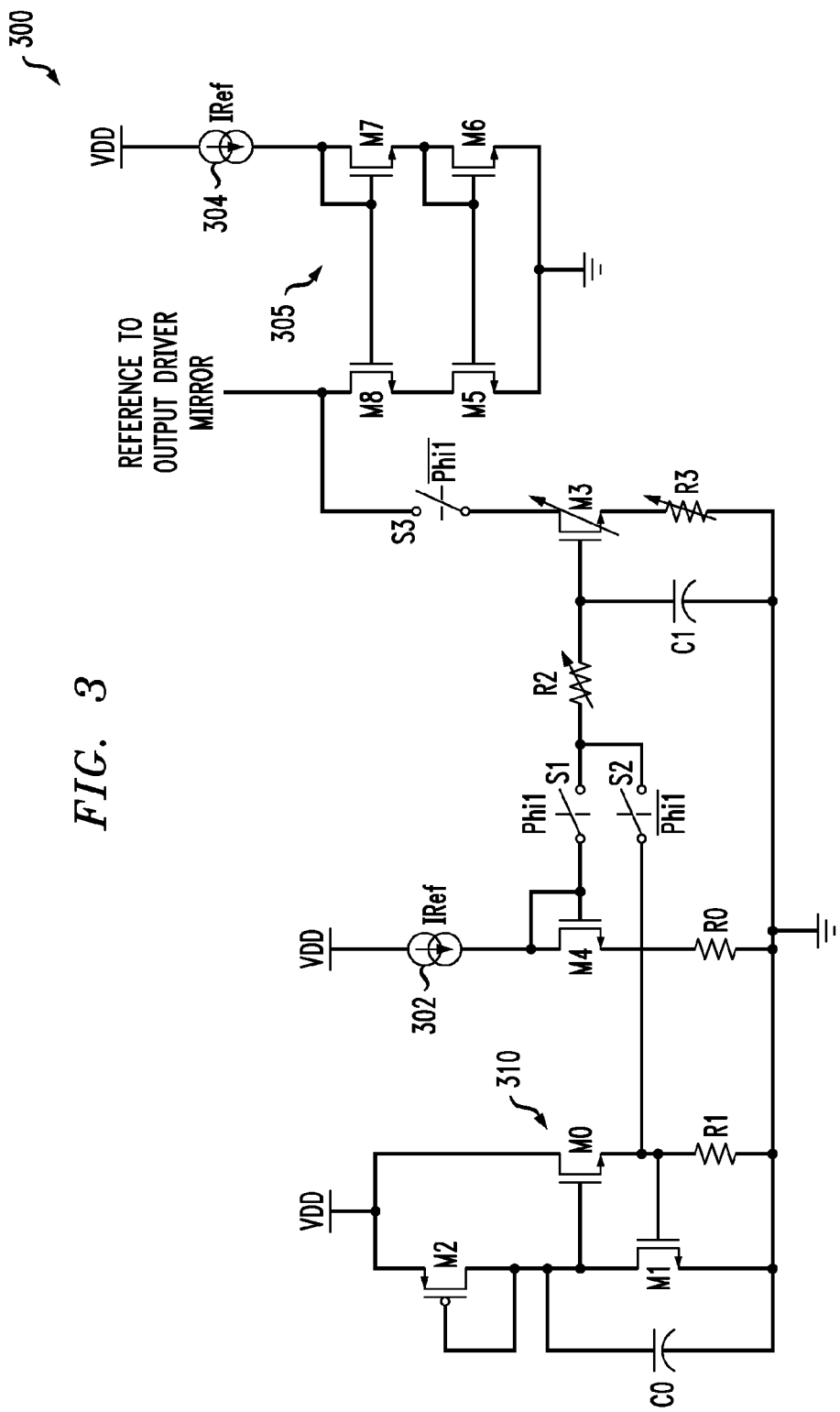
FIG. 3 is a schematic diagram of one possible implementation of a driver circuit in the laser of FIG. 2.

Referring now to FIG. 3, a portion 300 of the laser driver circuitry 200 showing an embodiment of overshoot controller 204 is illustrated. The circuitry 300 as shown includes current sources 302 and 304, n-type metal-oxide-semiconductor (NMOS) devices M0, M1 and M3-M8, p-type metal-oxide-semiconductor (PMOS) device M2, capacitors C0 and C1, fixed resistors R0 and R1, variable resistors R2 and R3, and switches S1, S2 and S3.

The circuitry 300 in the present embodiment is configured to provide a controlled amount of overshoot for pulses of the drive signal that turn on the laser diode 202. The turn-on pulses decay exponentially from an initial value to a final steady-state value in accordance with a specified time constant. The amount of overshoot provided for a given turn-on pulse is controlled as a function of an amount of time the drive signal is at its previous logic low state before transitioning to its logic high state. Thus, the amount of overshoot provided in the present embodiment is a function of the amount of time the laser diode has been permitted to cool, with more overshoot being provided if the laser diode has had a relatively long period of time to cool, and less overshoot being provided if the laser diode has had a relatively short period of time to cool. This can improve laser performance by ensuring that the laser diode is not subject to a drive signal with excessive overshoot under conditions in which such overshoot is unneeded or undesirable.

In the FIG. 3 circuitry, the switch S1 is opened and closed responsive to a mode select signal denoted Phi1 and the switches S2 and S3 are opened and closed responsive to the corresponding complementary signal, denoted Phi1-bar. The mode select signal Phi1 is at a logic high level when the laser diode 202 is to be turned off and is at a logic low level when the laser diode 202 is to be turned on. In the above-described write mode of the optical recording and playback system 100, the mode select signal may be viewed as corresponding to the input data applied to the laser driver circuitry 200. In other embodiments, such as an embodiment involving a HAMR system, the mode select signal may be at a logic high level for the magnetic write mode in which the laser diode is turned on and at a logic low level for the magnetic read mode in which the laser diode is turned off.

Figure 4:
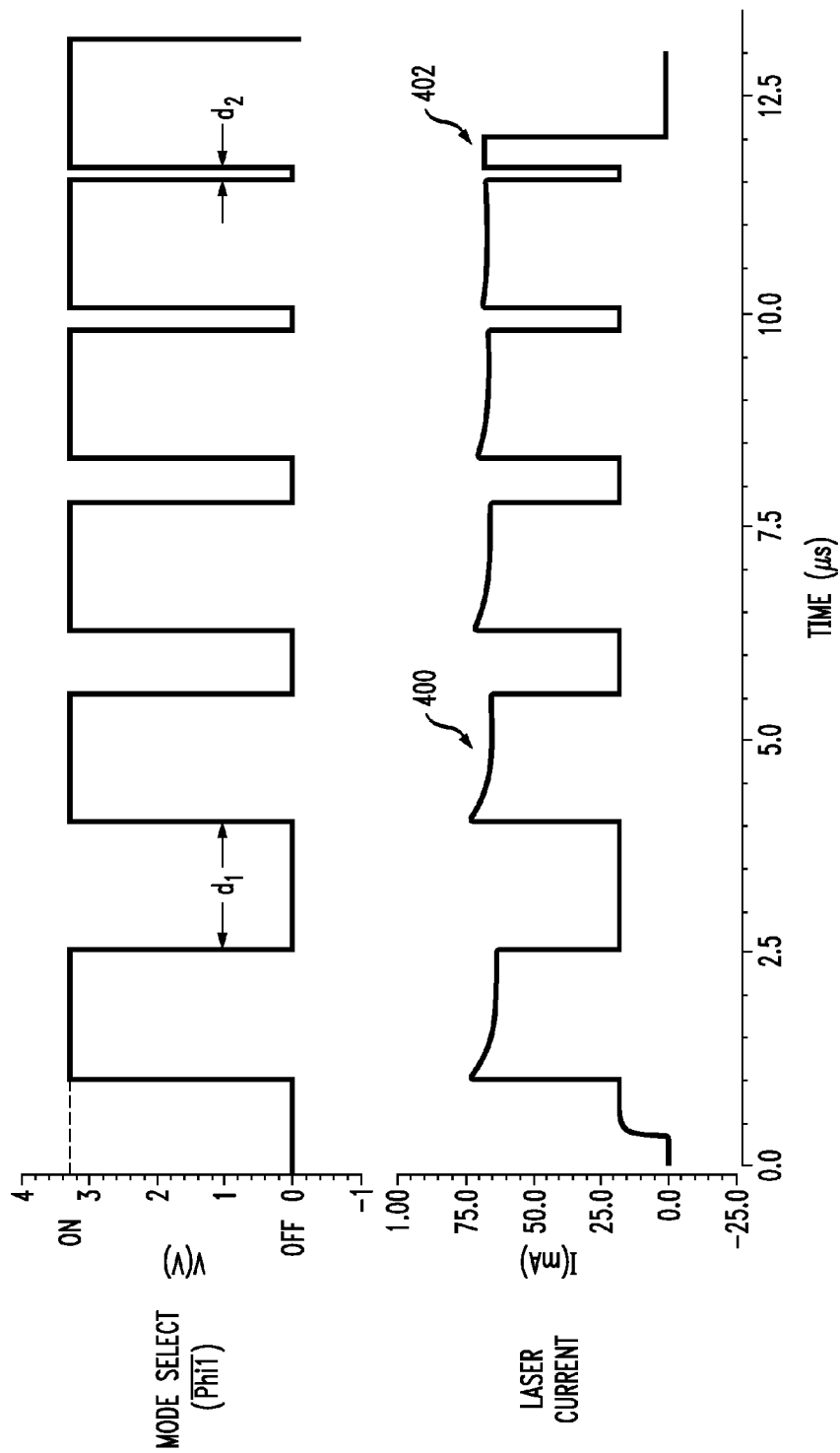
FIG. 4 shows signal waveforms associated with the exemplary driver circuit implementation of FIG. 3.

The upper signal shown in FIG. 4 is the complementary signal Phi1-bar, which is at a logic high level when the laser diode 202 is to be turned on and is at a logic low level when the laser diode is to be turned off. Thus, when the Phi1-bar signal is at a logic high level, the drive signal is in a first logic state associated with turning the laser diode on, and when the Phi1-bar signal is at a logic low level, the drive signal is in a second logic state associated with turning the laser diode off. The lower signal in FIG. 4 represents the current applied to the laser diode 202 and may be viewed as an example of what is more generally referred to herein as a "drive signal" generated by the driver circuitry 200. The drive signal in the present embodiment alternates between logic high and logic low states associated with respective on and off states of the laser diode 202.

As is apparent from FIG. 4, the amounts of overshoot provided for respective instances of the logic high state of the drive signal vary based on the durations of their respective immediately preceding logic low states. Accordingly, a given instance such as logic high state 400, which has an immediately preceding logic low state of relatively long duration $d_1$, is provided with a relatively large amount of overshoot, while another instance such as logic high state 402, which has an immediately preceding logic low state of relatively short duration $d_2$, is provided with substantially no overshoot. The overshoot provided generally follows the same exponential decay rate, but starts from a higher initial amplitude following logic low states of longer durations.

This advantageous effect is achieved in the circuitry 300 by providing a charging path through which capacitor C1 charges during the logic low state of the drive signal and a discharging path through which capacitor C1 discharges during the immediately following logic high state. The circuitry can be configured to charge and discharge at a programmable rate using variable resistor R2. A mirror created by device M3 and variable resistor R3 will automatically adjust the initial amplitude of the overshoot based on the amount of time C1 is permitted to charge. Such an arrangement serves to reduce or eliminate overshoot following shorter off durations, thereby improving laser operating performance, without the need for timers, logic gates or other complex circuitry arrangements that would unduly increase system cost.

It should be noted that device M3 is shown in the FIG. 3 embodiment as illustratively comprising a variable device. Accordingly, M3 may be scaled together with variable resistor R3 so that the gate-to-source voltage (Vgs) of M3 matches the Vgs of M4 so as to form a precise mirror.

In the circuitry 300, a reference current IRef from current source 302 is fed into device M4 and resistor R0 in order to set up a voltage reference to be used as a control voltage for the corresponding mirror comprising device M3 and resistor R3. Resistors R0 and R3 provide a more linear voltage to current relationship, such that an exponential voltage decay results in an exponential current decay.

During the laser diode off mode, when Phi1 is at a logic high level and its complement Phi1-bar is at a logic low level, switch S1 is closed and switches S2 and S3 are open. Capacitor C1 is charged via a charging path comprising resistor R2 to the voltage reference set up by M4 and R0. This drives the mirror formed by M3 and R3 to create the overshoot current which gets added into the main reference current. The main reference current is provided by circuitry 305, comprising current source 304 and devices M5 through M8, to an output driver mirror which is not explicitly shown but may be of conventional design. The particular resistance values provided by variable resistors R2 and R3 can be made programmable to provide adjustability in overshoot levels and exponential decay rates.

During the laser diode on mode, when Phi1 is at a logic low level and its complement Phi1-bar is at a logic high level, switch S1 is open and switches S2 and S3 are closed. Capacitor C1 is then discharged through a discharging path comprising resistor R2 to a designated voltage level set by level-setting circuitry 310 comprising M0 through M2, C0 and R1. The circuitry 310 is configured to bias M1 at nearly a threshold voltage by making M2 very weak, and the feedback through M0 drives the gate of M1 to achieve a buffered threshold voltage to which the voltage across capacitor C1 decays. This arrangement will create an exponentially decaying overshoot current in a given pulse of the drive signal, such as that shown in pulse 400 in the lower signal of FIG. 4.

The duration of the laser diode off mode controls the amount of time that capacitor C1 is permitted to charge through R2, and therefore the amount of overshoot that is provided in conjunction with the transition to the laser diode on mode. Thus, as illustrated in FIG. 4, as the laser diode off durations are made shorter, the overshoot amplitude will automatically decrease, and as the laser diode off durations are made longer, the overshoot amplitude will automatically increase. Moreover, the circuitry 300 provides a consistent overshoot decay setting over a wide variation of on and off durations.

Suitable values for R0, R1, C0 and C1 in the FIG. 3 embodiment are about 4 kohms, 4 kohms, 0.4 picofarads and 2 picofarads, respectively. The variable resistor R2 may be adjustable in a range of about 35 kohms to 800 kohms, and the variable resistor R3 may be adjustable in a range of about 1 kohm to 4 kohms. The reference current IRef may be on the order of about 200 microamps. These particular values are provided by way of illustration, and should not be viewed as limiting in any way. Those skilled in the art will recognize that a variety of other parameter values may be used.

Exemplary device sizes for the MOS devices M0 through M8 are given in the following table, although other device sizes may be used in other embodiments. The device sizes are given in terms of width and length in micrometers (μm). These width and length values are for a particular process technology. The device sizes used in a given embodiment may vary based on selected process technology, nominal reference voltage and other factors.

| Driver Circuitry Device Sizes | | |
| --- | --- | --- |
| Device | W (μm) | L (μm) |
| M0 | 5.0 | 0.35 |
| M2 | .32 | 10.0 |
| M1, M3, M4, M7 & M8 | 8.0 | 0.35 |
| M5 & M6 | 8.0 | 4.0 |

It is also to be appreciated that the particular circuitry arrangements shown in FIG. 3 are exemplary only, and numerous alternative configurations may be used. As one example, circuitry 310 could be eliminated and resistor R2 could instead be switched to ground during discharge. However, this alternative arrangement will tend to create more of a non-exponential decay as well as causing a delay in the initial turn on while the voltage ramps to the threshold voltage. As another example, resistor R2 could be replaced with two separate resistors, one in the charging path and one in the discharging path, which would allow the charging and discharging time constants to be set independently if desired.

The states of the switches S1, S2 and S3 in the present embodiment may be controlled responsive to a mode select signal and its complement as supplied from a controller, which is not explicitly shown in FIG. 3. The controller may be internal to the laser driver circuitry 200 or may be implemented at least in part outside of the laser 110 and optical module 102, such as within the processor 120. Also, as noted above, one or more programmable registers may be used to control time constants via adjustment of variable resistors R2 and R3. Numerous alternative switching and control signaling arrangements may be used to provide overshoot control based on duration of previous logic state in a given embodiment.

Again, it should be emphasized that the above-described embodiments of the invention are intended to be illustrative only. For example, other embodiments can use different types and arrangements of optical sources, driver circuits, overshoot controllers, capacitive and resistive elements, transistors, and charging and discharging paths. Also, the particular resistor and capacitor values, current and voltage sources and other driver circuit parameters and characteristics mentioned above in conjunction with the illustrative embodiments may be varied in other embodiments based on factors such as operating frequencies, control signaling, signal levels, laser diode types, etc. These and numerous other alternative embodiments within the scope of the following claims will be apparent to those skilled in the art.

What is claimed is:

1. An apparatus comprising:
a driver circuit configured to generate a drive signal for application to an optical source;
the driver circuit comprising an overshoot controller operative to provide an amount of overshoot for a given logic state of the drive signal as a function of a duration of at least one previous logic state of the drive signal.

2. The apparatus of claim 1 wherein the drive signal alternates between a first logic state associated with a first operating mode of the optical source and a second logic state associated with a second operating mode of the optical source.

3. The apparatus of claim 2 wherein the overshoot controller is configured to provide amounts of overshoot for respective instances of the first logic state that are proportional to the durations of their respective immediately preceding second logic states, such that one of the instances of the first logic state having an immediately preceding second logic state of relatively short duration is provided with a relatively small amount of overshoot and another one of the instances of the first logic state having an immediately preceding second logic state of relatively long duration is provided with a relatively large amount of overshoot.

4. The apparatus of claim 2 wherein the overshoot controller comprises:
a charging path through which a capacitive element charges;
a discharging path through which the capacitive element discharges; and switching circuitry for controlling activation of the charging and discharging paths responsive to the operating modes of the optical source;

wherein the amount of overshoot provided for a given instance of the first logic state, in conjunction with discharge of the capacitive element through the discharging path, is a function of an amount of time for which the capacitive element charges through the charging path during the immediately preceding second logic state.

5. The apparatus of claim 4 wherein the overshoot controller further comprises level-setting circuitry configured to establish a voltage level to which the capacitive element discharges via the discharging path during the given instance of the first logic level.

6. The apparatus of claim 2 wherein the first operating mode comprises an on state of the optical source and the second operating mode comprises an off state of the optical source.

7. The apparatus of claim 2 wherein the first operating mode comprises a write mode of the optical source and the second operating mode comprises a read mode of the optical source.

8. The apparatus of claim 1 wherein the driver circuit comprises a laser driver circuit.

9. The apparatus of claim 1 wherein the optical source comprises a laser diode.

10. A disk-based data storage system comprising the apparatus of claim 1.

11. The disk-based data storage system of claim 10 wherein the system comprises an optical disk system configured for at least one of recording and playback of data on an optical disk.

12. The disk-based storage system of claim 10 wherein the system comprises a heat-assisted magnetic recording system configured for recording of data on a magnetic disk.

13. An optical communication system comprising the apparatus of claim 1.

14. A method comprising:
generating a drive signal for application to an optical source; and
providing an amount of overshoot for a given logic state of the drive signal as a function of a duration of at least one previous logic state of the drive signal.

15. The method of claim 14 wherein the generating step comprises generating a drive signal that alternates between a first logic state associated with a first operating mode of the optical source and a second logic state associated with a second operating mode of the optical source.

16. The method of claim 15 wherein the providing step comprises providing amounts of overshoot for respective instances of the first logic state that are proportional to the durations of their respective immediately preceding second logic states, such that one of the instances of the first logic state having an immediately preceding second logic state of relatively short duration is provided with a relatively small amount of overshoot and another one of the instances of the first logic state having an immediately preceding second logic state of relatively long duration is provided with a relatively large amount of overshoot.

17. The method of claim 15 wherein the providing step comprises providing an amount of overshoot for a given instance of the first logic state, in conjunction with discharge of a capacitive element through a discharging path, that is a function of an amount of time for which the capacitive element charges through a charging path during the immediately preceding second logic state.

18. The method of claim 17 further including the step of establishing a voltage level to which the capacitive element discharges via the discharging path during the given instance of the first logic state.

19. A computer-readable storage medium having embodied therein executable code for controlling performance of the steps of the method of claim 14.

20. An apparatus comprising:
an integrated circuit comprising at least one driver circuit configured to generate a drive signal for application to an optical source;
the driver circuit comprising an overshoot controller operative to provide an amount of overshoot for a given logic state of the drive signal as a function of a duration of at least one previous logic state of the drive signal.

* * * * *